(12) United States Patent
Kariya et al.

(10) Patent No.: US 8,837,160 B2
(45) Date of Patent: Sep. 16, 2014

(54) HIGH-DIELECTRIC SHEET, A PRINTED CIRCUIT BOARD HAVING THE HIGH-DIELECTRIC SHEET AND PRODUCTION METHODS THEREOF

(75) Inventors: Takashi Kariya, Ibi-gun (JP); Hironori Tanaka, Ibi-gun (JP)

(73) Assignee: Ibiden Co., Ltd., Ogaki-shi (JP)

( * ) Notice: Subject to any disclaimer, the term of this patent is extended or adjusted under 35 U.S.C. 154(b) by 473 days.

(21) Appl. No.: 13/175,683

(22) Filed: Jul. 1, 2011

(65) Prior Publication Data

US 2011/0259629 A1 Oct. 27, 2011

Related U.S. Application Data

(62) Division of application No. 12/763,455, filed on Apr. 20, 2010, which is a division of application No. 11/580,927, filed on Oct. 16, 2006, now Pat. No. 8,707,552.

(30) Foreign Application Priority Data

Oct. 14, 2005 (JP) ................................ 2005-300319

(51) Int. Cl.
*H05K 1/16* (2006.01)
*H01L 21/48* (2006.01)
*H01L 23/50* (2006.01)
*H01L 23/498* (2006.01)
*H05K 3/38* (2006.01)
*H05K 3/46* (2006.01)

(52) U.S. Cl.
CPC ........ *H05K 1/162* (2013.01); *H05K 2201/0179* (2013.01); *H05K 2201/09563* (2013.01); *H05K 2201/096* (2013.01); *H01L 2924/0002* (2013.01); *H05K 3/388* (2013.01); *H01L 21/4867* (2013.01); *H05K 2201/0175* (2013.01); *H01L 23/50* (2013.01); *H01L 2924/3011* (2013.01); *H01L 23/498* (2013.01); *H05K 2201/09309* (2013.01); *H05K 2201/09536* (2013.01); *H05K 3/4602* (2013.01); *H05K 2201/0195* (2013.01); *H05K 2201/09718* (2013.01)
USPC ........................................................ 361/762

(58) Field of Classification Search
USPC ...................... 361/271, 762; 428/901; 29/846
See application file for complete search history.

(56) References Cited

U.S. PATENT DOCUMENTS

| 4,312,117 A | 1/1982 | Robillard et al. |
| 4,496,610 A | 1/1985 | Cattell et al. |

(Continued)

FOREIGN PATENT DOCUMENTS

| EP | 1696716 A1 | 8/2006 |
| JP | 6-32613 | 2/1994 |

(Continued)

*Primary Examiner* — Evan Pert
(74) *Attorney, Agent, or Firm* — Oblon, Spivak, McClelland, Maier & Neustadt, L.L.P.

(57) ABSTRACT

A method of producing a capacitor for a printed circuit board includes producing high-dielectric sheets and selecting ones of the high-dielectric sheets, which are substantially free from a defect after the heat process. Each of the high-dielectric sheets is produced by providing a first electrode, forming a first sputter film on the first electrode, forming an intermediate layer on the first sputter film by calcining a sol-gel film, forming a second sputter film on the intermediate layer, and providing a second electrode on the second sputter film. The high-dielectric sheets are subjected to a heat process in which the high-dielectric sheets are subjected to a first temperature at least once and a second temperature higher than the first temperature at least once.

10 Claims, 8 Drawing Sheets

(56) References Cited

U.S. PATENT DOCUMENTS

| | | |
|---|---|---|
| 5,854,499 A | 12/1998 | Nishioka |
| 5,939,744 A | 8/1999 | Horikawa et al. |
| 5,970,337 A | 10/1999 | Nishioka |
| 6,229,166 B1 | 5/2001 | Kim et al. |
| 6,284,382 B1 | 9/2001 | Ishikawa et al. |
| 6,392,265 B2 | 5/2002 | Kondo et al. |
| 6,410,858 B1 | 6/2002 | Sasaki et al. |
| 6,818,469 B2 | 11/2004 | Mori et al. |
| 6,929,956 B2 | 8/2005 | Kim et al. |
| 6,961,230 B2 | 11/2005 | Otsuka et al. |
| 7,031,138 B2 | 4/2006 | Moon et al. |
| 2002/0096663 A1 | 7/2002 | Sato et al. |
| 2003/0137056 A1 | 7/2003 | Taniguchi et al. |
| 2003/0213615 A1 | 11/2003 | Utsumi et al. |
| 2004/0231885 A1 | 11/2004 | Borland et al. |
| 2005/0106802 A1 | 5/2005 | Nishiyama et al. |
| 2005/0194868 A1 | 9/2005 | Kashiwaya et al. |
| 2006/0137905 A1 | 6/2006 | Kariya et al. |
| 2007/0013049 A1 | 1/2007 | Asai et al. |

FOREIGN PATENT DOCUMENTS

| | | |
|---|---|---|
| JP | 8-31951 | 2/1996 |
| JP | 2000-44239 | 2/2000 |
| JP | 2002-26266 | 1/2002 |
| JP | 2005-191559 | 7/2005 |
| TW | 522547 | 3/2003 |
| WO | WO 2005/055684 A1 | 6/2005 |

HIGH-DIELECTRIC SHEET, A PRINTED CIRCUIT BOARD HAVING THE HIGH-DIELECTRIC SHEET AND PRODUCTION METHODS THEREOF

CROSS-REFERENCE TO RELATED APPLICATIONS

This application is a divisional of and claims the benefit of priority from U.S. application Ser. No. 12/763,455, filed Apr. 20, 2010, which is a divisional of and claims the benefit of priority from U.S. application Ser. No. 11/580,927, filed Oct. 16, 2006, which is based upon and claims the benefit of priority to prior Japanese Patent Application No. 2005-300319, filed Oct. 14, 2005. The contents of those applications are incorporated herein by reference in their entirety.

BACKGROUND OF THE INVENTION

1. Field of the Invention

The present invention is related to a high-dielectric sheet, a printed circuit board having the high-dielectric sheet, and methods of producing the high-dielectric sheet and printed circuit board.

2. Discussion of the Background

A high-dielectric sheet is used as a thin-film capacitor provided inside a printed circuit board (herein after referred to as "PCB"). Japanese Unexamined Patent Publication 2005-191559 describes a method of producing a high-dielectric sheet. In this method, a 1.2 µm-thick high-dielectric layer is formed on a copper foil by repeating several times a process in which a mixed solution of diethoxy barium and titanium bitetraisopropoxide is hydrolyzed to make a sol-gel solution, which is spincoated, dried and calcined on the copper foil. Then, a copper foil is formed on the high-dielectric layer by vacuum deposition. The above reference also discusses a method for forming a high-dielectric layer by sputtering using barium titanate as a target material.

However, in this method, when a high-dielectric layer is formed by using a sol-gel solution, pinholes may occur after organic materials or solvents are decomposed or evaporate during the process of forming the high-dielectric layer. Such pinholes are unwelcome, since they may become the starting points of cracks. Also, plating liquids may seep into those pinholes when plating a metal foil on the high-dielectric layer, thereby forming a conductor running through the high-dielectric layer and potentially causing short-circuits. Furthermore, when a high-dielectric layer is formed by sputtering, pits (hollows) may occur on the surface. Such pits are not welcome, since they may also become the starting points of cracks in the high-dielectric layer. It is thus desired to produce a high-dielectric layer by a method which does not produce cracks in the high-dielectric layer and short-circuits between electrodes. The contents of the above publication are herein incorporated by reference in their entirety.

SUMMARY OF THE INVENTION

According to one aspect of the present invention, a method of producing a high-dielectric sheet for a printed circuit board, includes providing a first electrode, forming a first sputter film on the first electrode, forming an intermediate layer on the first sputter film by calcining a sol-gel film, forming a second sputter film on the intermediate layer, and providing a second electrode on the second sputter film.

According to another aspect of the present invention, a method of producing a capacitor for a printed circuit board, includes producing plural high-dielectric sheets, each of the high-dielectric sheets being produced by providing a first electrode, forming a first sputter film on the first electrode, forming an intermediate layer on the first sputter film by calcining a sol-gel film, forming a second sputter film on the intermediate layer, and providing a second electrode on the second sputter film, and subjecting the high-dielectric sheets to a process in which the high-dielectric sheets are subjected to a first temperature at least once and a second temperature higher than the first temperature at least once, and selecting ones of the high-dielectric sheets, which are substantially free from a defect after the heat process.

According to yet another aspect of the present invention, a method of producing a printed circuit board, includes providing a core substrate, and providing a capacitor over the core substrate, the capacitor being produced by providing a first electrode, forming a first sputter film on the first electrode, forming an intermediate layer on the first sputter film by calcining a sol-gel film, forming a second sputter film on the intermediate layer, and providing a second electrode on the second sputter film.

According to yet another aspect of the present invention, a high-dielectric sheet for a printed circuit board, includes a first electrode, a first sputter film formed on the first electrode, an intermediate layer formed on the first sputter film by calcining a sol-gel film, a second sputter film formed on the intermediate layer, and a second electrode provided on the second sputter film.

According to yet another aspect of the present invention, a printed circuit board includes a core substrate, and a capacitor provided over the core substrate, the capacitor having a first electrode, a first sputter film formed on the first electrode, an intermediate layer formed on the first sputter film by calcining a sol-gel film, a second sputter film formed on the intermediate layer, and a second electrode provided on the second sputter film.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1:
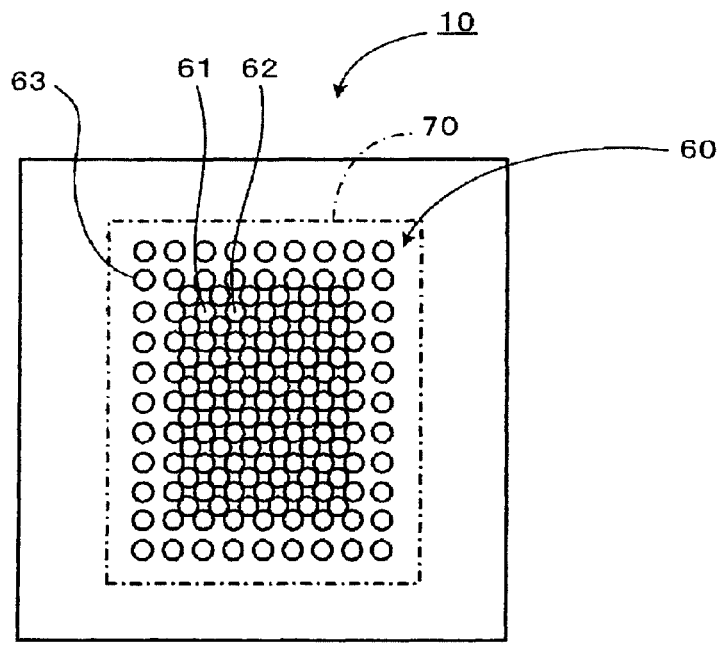
FIG. 1 is a plan view of a multilayered PCB according to one embodiment of the present invention.

The embodiments will now be described with reference to the accompanying drawings, wherein like reference numerals designate corresponding or identical elements throughout the various drawings.

FIG. 1 is a plan view of a multilayered PCB according to one embodiment of the present invention. Referring to FIG. 1, a multilayered PCB 10 has a mounting part 60 on which a semiconductor component 70 is mounted. In the mounting part 60, ground pads 61, power source pads 62 and signal pads 63 are provided. The ground pads 61 are used for connection to a ground line which grounds the semiconductor element 70. The power source pads 62 are for connection to a power source line which supplies an electrical potential from a power source to a semiconductor element 70. The signal pads 63 are provided for connection to a signal line which inputs and outputs signals to and from the semiconductor element 70. According to the present embodiment, ground pads 61 and power source pads 62 are positioned either in a lattice-like or zigzag pattern around the center of the mounting part 60, and signal pads 63 are positioned around those pads in a lattice-like or zigzag pattern or at random. The total number of pads on mounting part 60 is 1,000-30,000.

Figure 9:
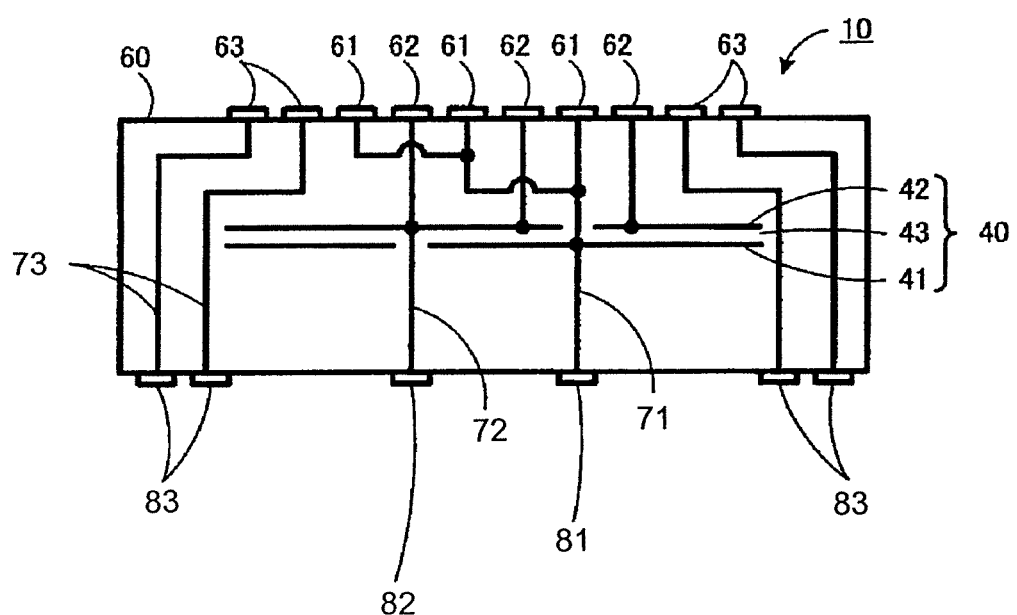
FIG. 9 is a schematic illustration of multilayered PCB showing connections between pads and lines.

FIG. 9 is a schematic illustration of multilayered PCB 10 showing connections between pads and lines. As shown in FIG. 9, multilayered PCB 10 has external terminals located on the surface opposite to mounting part 60. Specifically, an external ground terminal 81, an external power source terminal 82 and external signal terminals 83 are provided and connected with ground pads 61, power source pads 62 and signal pads 63 through a ground line 71, a power source line 72 and signal lines 73, respectively. The signal lines 73 are provided independently from the ground line 71 and power source line 72 inside multilayered PCB 10. The power source line 72 is connected to an upper electrode 42 of a thin-film capacitor 40 (see FIG. 2), and the ground line 71 is connected to a lower electrode 41 of the thin-film capacitor 40.

Figure 2:
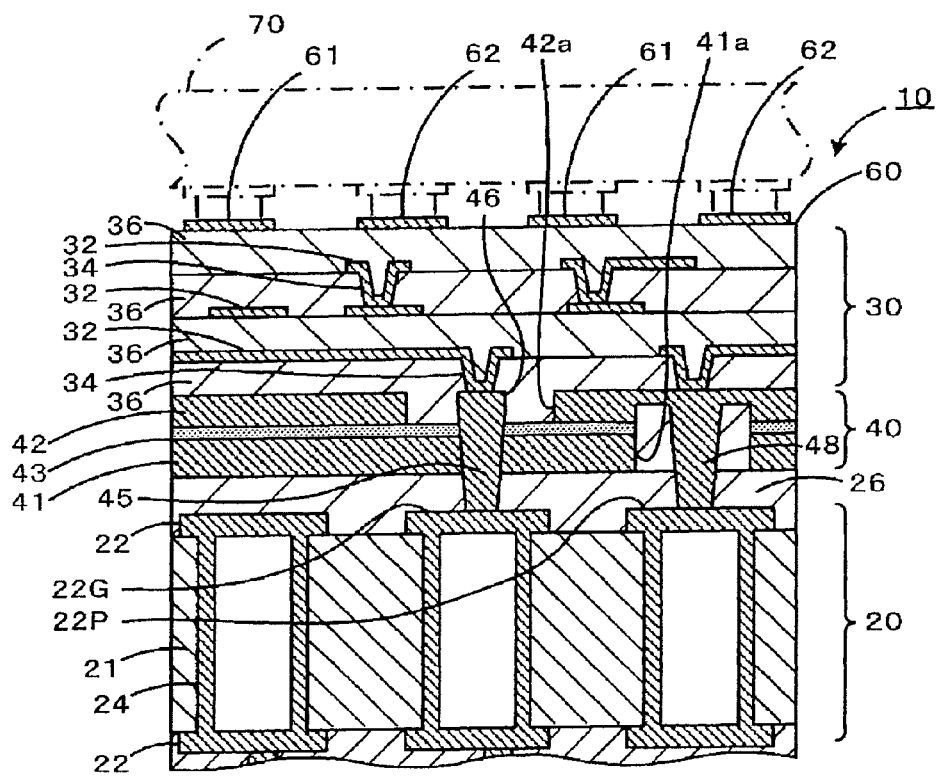
FIG. 2 is a cross-sectional view showing a part of the multilayered PCB.

FIG. 2 is a cross-sectional view of a part of the multilayered PCB 10. As shown in FIG. 2, multilayered PCB 10 has a core substrate 20, a build-up part 30 and the thin-film capacitor 40. The thin-film capacitor 40 is formed above core substrate 20 with an insulation layer 26 provided therebetween. The build-up part 30 is formed above thin-film capacitor 40, and the mounting part 60 is formed on the topmost layer of build-up part 30. Each of ground pads 61, power source pads 62 and signal pads 63 provided in mounting part 60 is electrically connected to conductive layers (BU conductive layers) 32 which are wiring patterns formed inside build-up part 30. Core substrate 20 has conductive layers 22 and a through-hole conductor 24. Conductive layers 22 are made of copper and formed on the top and bottom surfaces of a core substrate body 21, which is made of BT (bismaleimide-triazine) resin or glass epoxy substrate or the like. The through-hole conductor 24 is made of copper and provided on the inner surface of a through-hole which vertically passes through core substrate body 21. Conductive layers 22 are electrically connected to each other via through-hole conductor 24.

Figure 3:
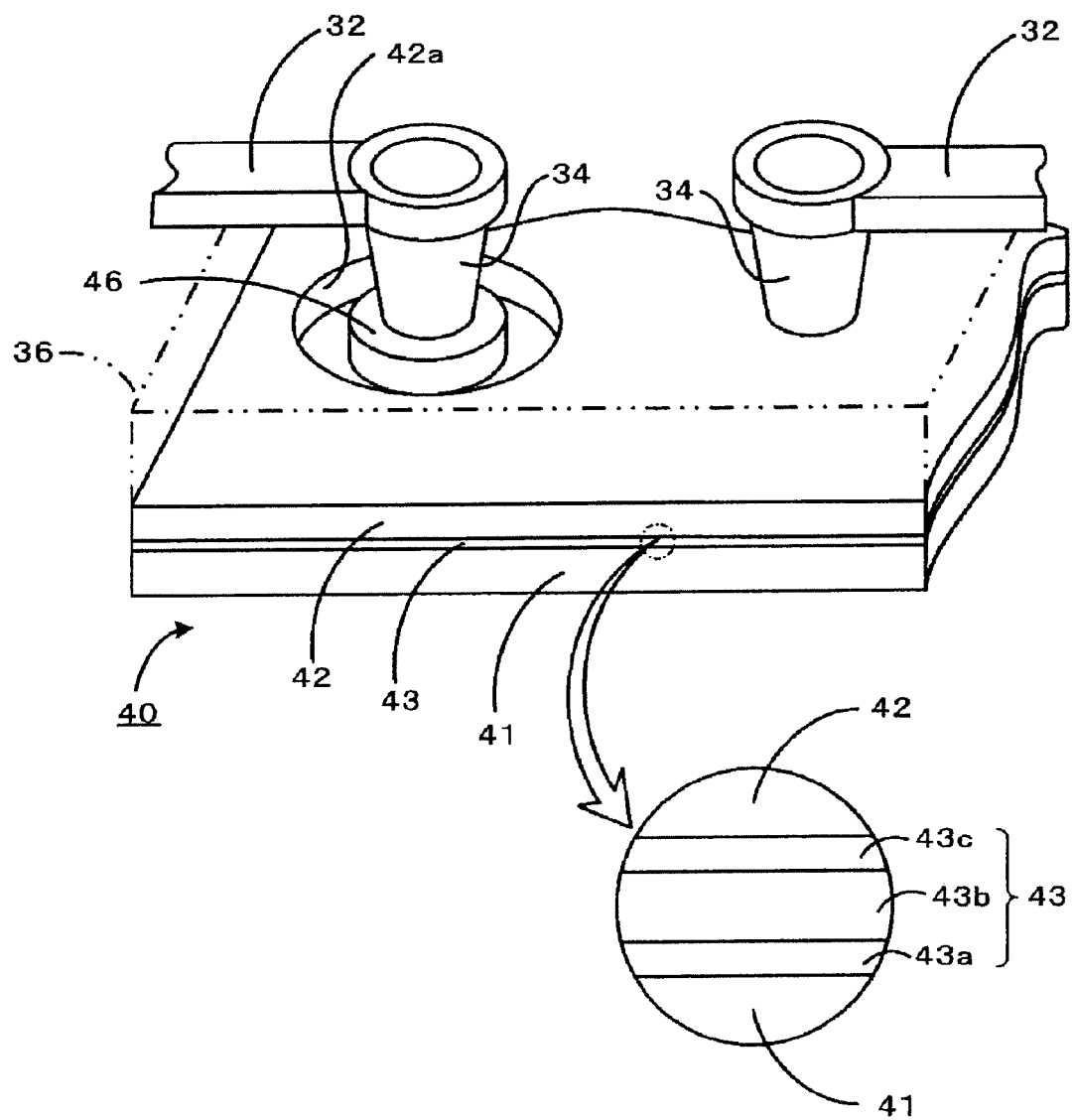
FIG. 3 is a perspective view of a thin-film capacitor in the multilayered PCB.

FIG. 3 is a perspective view of the thin-film capacitor 40 provided inside the multilayered PCB 10. As shown in FIGS. 2 and 3, thin-film capacitor 40 has a high-dielectric layer 43, a lower electrode 41 and an upper electrode 42. Lower electrode 41 and upper electrode 42 sandwich high-dielectric layer 43 which is made of a ceramic-type high-dielectric material produced by calcining high-dielectric material at a high temperature. Lower electrode 41 and upper electrode 42 are made of nickel and copper, respectively.

As illustrated in FIG. 9, lower electrode 41 is electrically connected to ground pads 61 in mounting part 60, while upper electrode 42 is electrically connected to power source pads 62 in mounting part 60. Therefore, lower electrode 41 and upper electrode 42 are connected respectively to the ground line 71 and power source line 72 of semiconductor element 70 mounted on mounting part 60.

Referring back to FIG. 2, lower electrode 41 is a plane pattern formed below high-dielectric layer 43, and has a through-hole (41a) which allows an upper via-hole conductor 48 to vertically pass through without making contact. Upper via-hole conductor 48 electrically connects the upper electrode 42 with a power source conductive layer (22P), which is one of the conductive layers 22 on core substrate 20. Lower electrode 41 may have a through-hole for each signal line to pass through lower electrode 41 without contact. However, it is preferred that each signal line be formed outside lower electrode 41 (see FIG. 9). Upper electrode 42 is a plane pattern formed on top of high-dielectric layer 43, and has a through-hole (42a) which allows a lower via-hole conductor 45 to pass through upper electrode 42 without making contact. Lower via-hole conductor 45 electrically connects lower electrode 41 with a ground conductive layer (22G), which is one of the conductive layers 22 on core substrate 20. Upper electrode 42 may have a through-hole for each signal line to vertically pass through without contact. However, it is preferable that each signal line be formed outside upper electrode 42 (see FIG. 9). High-dielectric layer 43 has three layers comprised of ceramic film, and these films are made of one or more metal oxides including $BaTiO_3$, $SrTiO_3$, $TaO_3$, $Ta_2O_5$, PZT, PLZT, PNZT, PCZT and PSZT, and the total thickness of the high-dielectric layer 43 is in the range of 0.4-3 µm. As shown in FIG. 3, the three ceramic films, that is, a first sputter film (43a), an intermediate layer (43b) and a second sputter film (43c) are laminated in this order from the side of lower electrode 41. First sputter film (43a) and second sputter film (43c) are formed by a sputtering process, and intermediate layer (43b) is formed by calcining a sol-gel film. The individual thickness of first sputter film (43a) and second sputter film (43c) is 0.1 µm or greater, and the intermediate layer (43b) is thicker than both first sputter film (43a) and second sputter film (43c).

As shown in FIG. 2, build-up part 30 is formed above thin-film capacitor 40 by alternately laminating build-up part insulation layers (BU insulation layers) 36 and BU conductive layers 32. Each BU conductive layer 32 is comprised of one or more conductive circuits provided on the BU insulation layer 36. BU conductive layers 32, which vertically sandwich BU insulation layers 36, are electrically connected to each other through a BU via-hole conductor 34. BU conductive layers 32 are also electrically connected to upper electrode 42 of thin-film capacitor 40 through BU via-hole conductor 34. As BU part 30 is made thinner, BU conductive layer 32 is formed thinner than lower electrode 41. The mounting part 60 is formed on the topmost layer of the BU part 30.

BU part 30 as described above may be formed by, for example, a subtractive or additive process (including semi-additive or full-additive processes). Specifically, a resin insulation sheet is first laminated on top and bottom surfaces of core substrate 20 to form BU insulation layers 36 (having Young's modulus of, for example, 2-7 GPa, at room temperature). The resin sheet used above is made of a denatured epoxy type resin, polyphenylene ether type resin, polyimide type resin, cyano ester type resin, or the like, and its thickness is in the approximate range of 20-80 μm. Inorganic materials such as silica, alumina, zirconia, or the like, may be dispersed in such a resin sheet. Next, through-holes are formed in the above-laminated resin sheet by using a $CO_2$ gas laser, UV laser, YAG laser, excimer laser, or the like, then the surfaces of the resin sheets and the inner surfaces of the through-holes are plated with electroless copper to make conductive layers. A plating resist is formed in areas on the conductive layers, and electrolytic copper plating is applied except the areas where the plating resist is formed. BU conductive layers 32 are formed after the electroless copper plating provided under the resist is removed with an etching solution. The inner surfaces of the through-hole become BU via-hole conductors 34. The above process is repeated to form build-up part 30. In the present embodiment, lower electrode 41 of thin-film capacitor 40 is thicker than BU conductive layer 32.

The above-described multilayered PCB 10 has the following use, for instance. First, semiconductor element 70, having solder bumps on its bottom surface, is installed on mounting part 60. During the mounting procedure, ground, power source and signal terminals of semiconductor element 70 are brought into contact respectively with ground pads 61, power source pads 62, and signal pads 63 of mounting part 60, and soldered by a reflow process. Then, multilayered PCB 10 is installed on another PCB such as a motherboard. Before the installment, solder bumps are formed on a pad provided on the bottom surface of the multilayered PCB 10. The pad is connected to the corresponding pad of another PCB by a reflow process. Because thin-film capacitor 40 provided in multilayered PCB 10 has high-dielectric layer 43 made of high-permittivity ceramic, and because lower electrode 41 and upper electrode 42 are large plane patterns (may include partially open areas), the thin-film capacitor 40 has a larger capacitance. Thus, the thin-film capacitor 40 produces a sufficient decoupling effect, thereby reducing the risk of lower power supply to a transistor of semiconductor element (IC) 70 provided on mounting part 60. If necessary, chip-capacitors may be installed around mounting part 60 of multilayered PCB 10.

Figure 4:
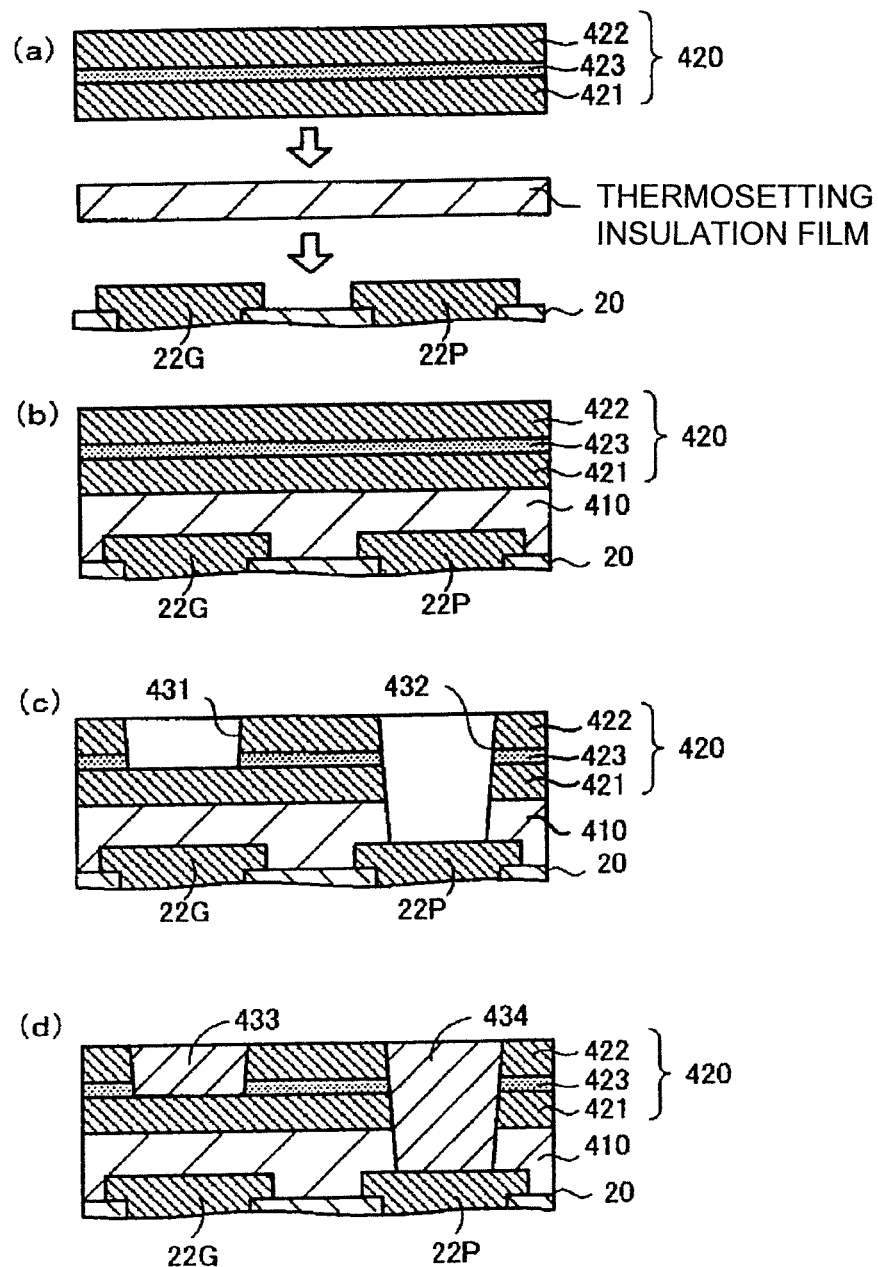
FIGS. 4(a)-4(d) are cross-sectional views of a multilayered PCB being produced by a method according to one embodiment of the present invention.

FIGS. 4(*a*)-4(*d*) are cross-sectional views illustrating production of a multilayered PCB 10 by a method according to one embodiment of the present invention. Referring to FIGS. 4(*a*)-4(*d*), a manufacturing process of multilayered PCB 10 of the present embodiment is described. First, as shown in FIG. 4(*a*), a thermosetting insulation film (ABF-45SH made by Ajinomoto Fine-Techno Co., Ltd.) is laminated on core substrate 20 by using a vacuum laminator under conditions calling for a temperature range of 50-150° C. and a pressure range of 0.5-1.5 MPa. This thermosetting insulation film becomes an insulation layer 26 under thin-film capacitor 40 illustrated in FIG. 2. Then, a high-dielectric sheet 420 comprised of a high-dielectric layer 423 sandwiched between a nickel foil 421 and a copper foil 422 is attached onto the thermosetting insulation film by using a vacuum laminator under conditions calling for a temperature range of 50-150° C. and a pressure range of 0.5-1.5 MPa, then dried for an hour at 150° C. (see FIG. 4(*b*)). Through this process, the thermosetting resin film is hardened and becomes an interlayer insulation layer 410. Nickel foil 421 and copper foil 422 of high-dielectric sheet 420 used in the above lamination process are plane patterns without circuit patterns. However, nickel foil 421 may be laminated after etching out areas which will not be used later, for example, those areas to become through-holes (41*a*).

Figure 5:
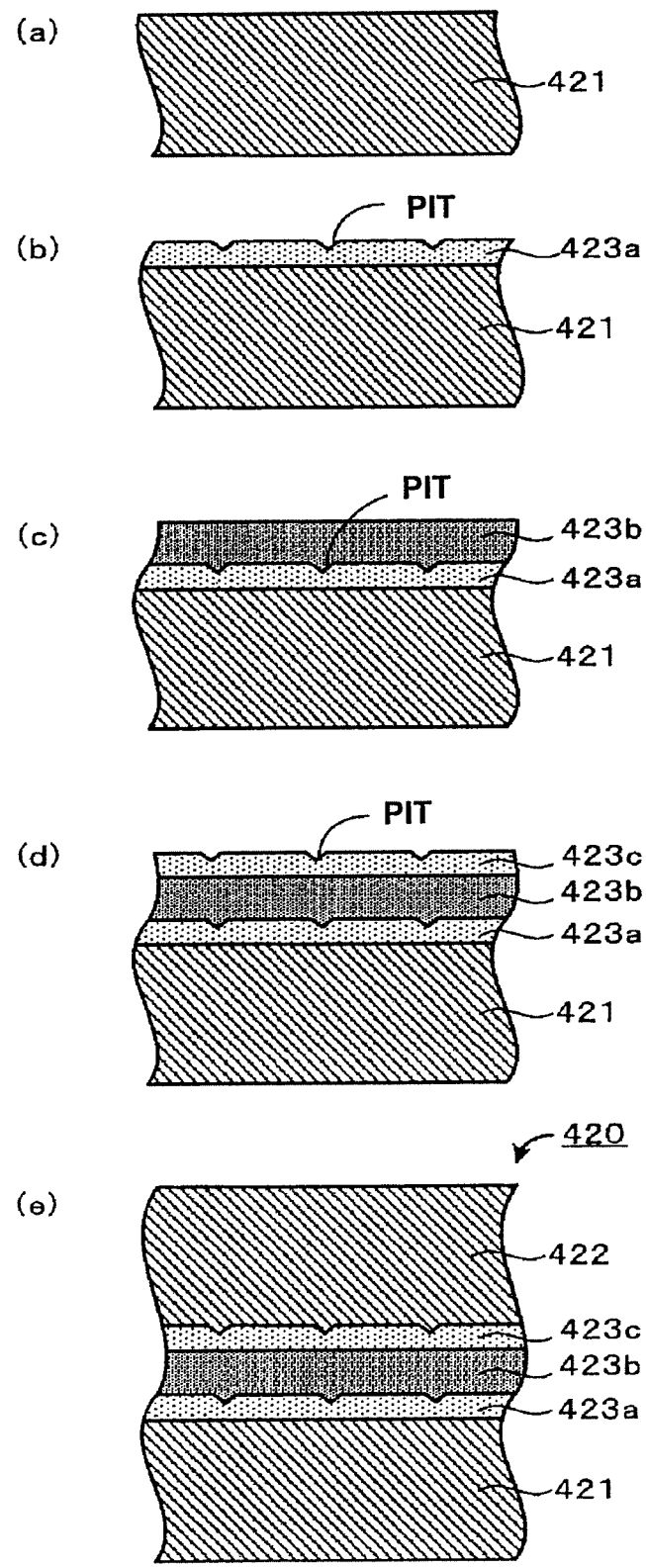
FIGS. 5(a)-5(e) are cross-sectional views of a high-dielectric sheet being produced by a method according to one embodiment of the present invention.

FIGS. 5(*a*)-5(*e*) are cross-sectional views illustrating production of the high-dielectric sheet 420. Referring to FIGS. 5(*a*)-5(*e*), a manufacturing process of high-dielectric sheet 420 is described. First, nickel foil 421 (an electrode) with an approximate thickness of 100 μm is prepared (see FIG. 5(*a*)) and heated at a temperature in the range of 400-700° C. (550° C. in the present embodiment). This heating procedure enhances crystallinity of high-dielectric layer 423 formed on nickel foil 421. After nickel foil 421 is heated, its surface is polished to make the nickel foil approximately 90 μm thick. A first sputter film (423*a*) is formed on nickel foil 421 (see FIG. 5(*b*)). More specifically, a sputtering target of BaTiOx (made by Japan Pure Chemical Co., Ltd.) is furnished in a magnetron-sputtering apparatus (made by Canon Anelva Corporation, serial number L-332S-FH), and sputtering is conducted by using a DC or AC power source and gas mainly including argon and oxygen at a pressure in the range of 3-10 mTorr. The oxygen level in the sputtering gas may be in the range of 10-90% by volume, preferably 45-55% by volume. Gas with an oxygen level 50% by volume is used in the present embodiment. RF power range is 2-5 W/cm$^2$ and a sputtering pressure range is 0.5-2 Pa. A 0.25 μm-thick first sputter film (423*a*) is formed. Since first sputter film (423*a*) is thinner, even if pits occur on its surface, they are smaller and shallower.

An intermediate layer (423*b*) is then formed on first sputter film (423*a*) (see FIG. 5(*c*)) by the following process. Specifically, diethoxy barium and titanium bitetraisopropoxide are weighed in a dry nitrogen atmosphere to prepare a solution with a concentration of 1.0 mol/liter in a mixed solvent of dehydrated methanol and 2-methoxyethanol (volume ratio 3:2). Then, the solution is blended for three days in a nitrogen atmosphere at room temperature to prepare a solution containing a barium-titanium alkoxide precursor composition. Decarbonated water is sprayed at a speed of 0.5 microliter/minute in an atmospheric nitrogen current to hydrolyze the precursor composition solution while blending it at a constant temperature of 0° C. until it finally becomes a sol-gel solution. The sol-gel solution is filtered through a 0.2-micron filter to remove precipitates. The filtered solution is then spin-coated to form a sol-gel film on first sputter film (423*a*) at a speed of 1500 rpm for 1 minute. The substrate after the spincoating is dried for 3 minutes on a hot plate at a constant temperature of 150° C., then put in an electric oven having a constant temperature of 850° C. to calcine the sol-gel film for 15 minutes. The viscosity of the solution is adjusted so that a layer thickness obtained after the spincoat/dry/calcine cycle becomes 0.03 μm. After repeating 10 spincoat/dry/calcine cycles, a 0.3 μm-thick intermediate layer (423*b*) is formed. Pits on the surface of first sputter film (423*a*) are filled with the sol-gel solution when the sol-gel film is formed.

Next, second sputter film (423*c*) is formed on intermediate layer (423*b*) (see FIG. 5(*d*)). To form a 0.15 μm-thick second sputter film (423*c*), the same magnetron sputtering apparatus is used as in the formation of first sputter film (423*a*). At this stage, high-dielectric layer 423 with a total film thickness of 0.7 μm is formed on nickel foil 421. Since second sputter film (423*c*) is thinner, even if pits occur on its surface, they are smaller and shallower. Intermediate layer (423*b*) is sandwiched between first and second sputter films (423*a*) and (423*c*).

Following the above process, a copper layer is formed on high-dielectric layer 423 by electroless plating. Copper foil 422 (opposite electrode) is formed by, for example, electrolytically plating another copper layer of approximate thickness 10 μm on top of the above copper layer. Accordingly, high-dielectric sheet 420 is formed. After repeating 20 times a cycle where high-dielectric sheet 420 is left for 5 minutes at a temperature of −55° C. and then left for 5 minutes at 125° C., a sheet free of defects such as cracks is used for the next process. The dielectric characteristics of the high-dielectric sheet obtained according to the above-described procedures are measured using IMPEDANCE/GAIN-PHASE ANALYZER (made by Hewlett-Packard Development Company, L.P., product name 4194A) under conditions calling for a frequency of 1 Hz, a temperature of 25° C. and an OSC level of 1V. In one example, the specific dielectric constant was 1300. In the method described above, the first sputter film, intermediate layer and second sputter film of the high-dielectric layer are all made of barium titanate. However, any of the following may be used: strontium titanate ($SrTiO_3$), tantalum oxides ($TaO_3$, $Ta_2O_5$), lead zirconate titanate (PZT), lead lanthanum zirconate titanate (PLZT), lead niobium zirconate titanate (PNZT), lead calcium zirconate titanate (PCZT) and lead strontium zirconate titanate (PSZT). Also, the first sputter film, intermediate layer and second sputter film may be made of the same material or different materials.

Referring back to FIGS. 4(a)-4(d), through-holes 431 and 432 are formed by laser beams at predetermined positions in high-dielectric sheet 420, laminated on the unfinished substrate (see FIG. 4(c)). Through-hole 431 is formed on dielectric sheet 420 at the opposite position to ground conductive layer (22G), which is one of the conductive layers 22 on core substrate 20. Through-hole 431 penetrates copper foil 422 and high-dielectric layer 423 and reaches the top surface of nickel foil 421. Through-hole 432 is formed on dielectric sheet 420 at the opposite position to a conductive layer (22P) for the power source, which is one of the conductive layers 22 on core substrate 20. Through-hole 432 penetrates high-dielectric sheet 420 and an interlayer insulation layer 410 and reaches the top surface of power source conductive layer (22P). Deeper through-hole 432 is formed before shallower through-hole 431 is formed. Each depth is adjusted by varying the number of laser shots. Specifically, through-hole 432 is formed by using a UV laser (made by Hitachi Via Mechanics, Ltd.) under conditions calling for power output of 3-10 W, frequency of 25-60 kHz, and number of shots 62; through-hole 431 is formed under the same conditions, except the number of shots is 22. After through-holes 431 and 432 are formed, they are filled with through-hole filler resin. The filler resins become inner-hole resins 433 and 434 after being dried for an hour at 80° C., for an hour at 120° C., then for 30 minutes at 150° C. (see FIG. 4(d)). The filler resins to fill the through-holes are prepared as follows: 100 parts by weight of bisphenol-F epoxy monomer (made by Japan Epoxy Resins, Co., Ltd., molecular amount: 310, product name: E-807) are mixed with 6 parts by weight of imidazole hardening agent (made by Shikoku Chemicals Corporation, product name: 2E4MZ-CN). Then, 170 parts by weight of spherical particles $SiO_2$ with an average particle diameter of 1.6 μm are added to the mixture, and the viscosity of the mixture is adjusted to 45000-49000 cps at a temperature of 23±1° C. by kneading the mixture using three rollers.

Figure 6:
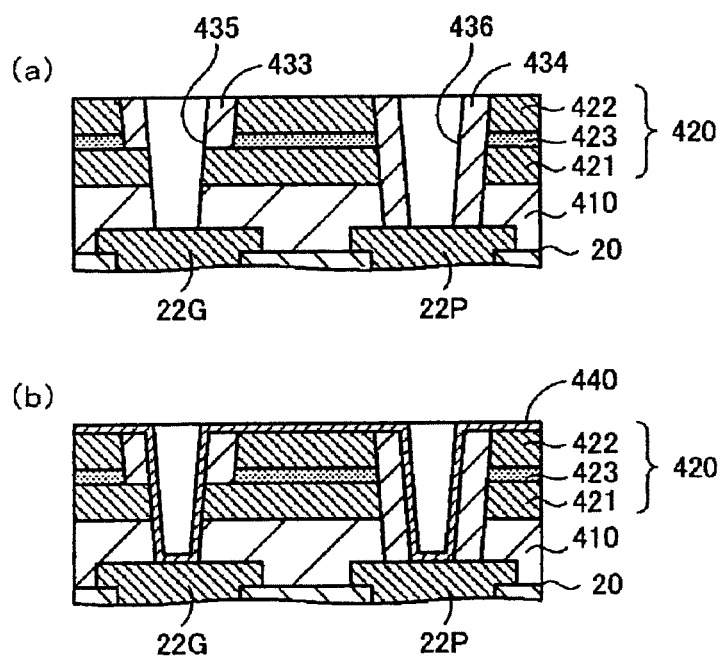
FIGS. 6(a) and 6(b) are cross-sectional views of the multilayered PCB under production after the steps shown in FIGS. 4(a)-4(d)
Figure 7:
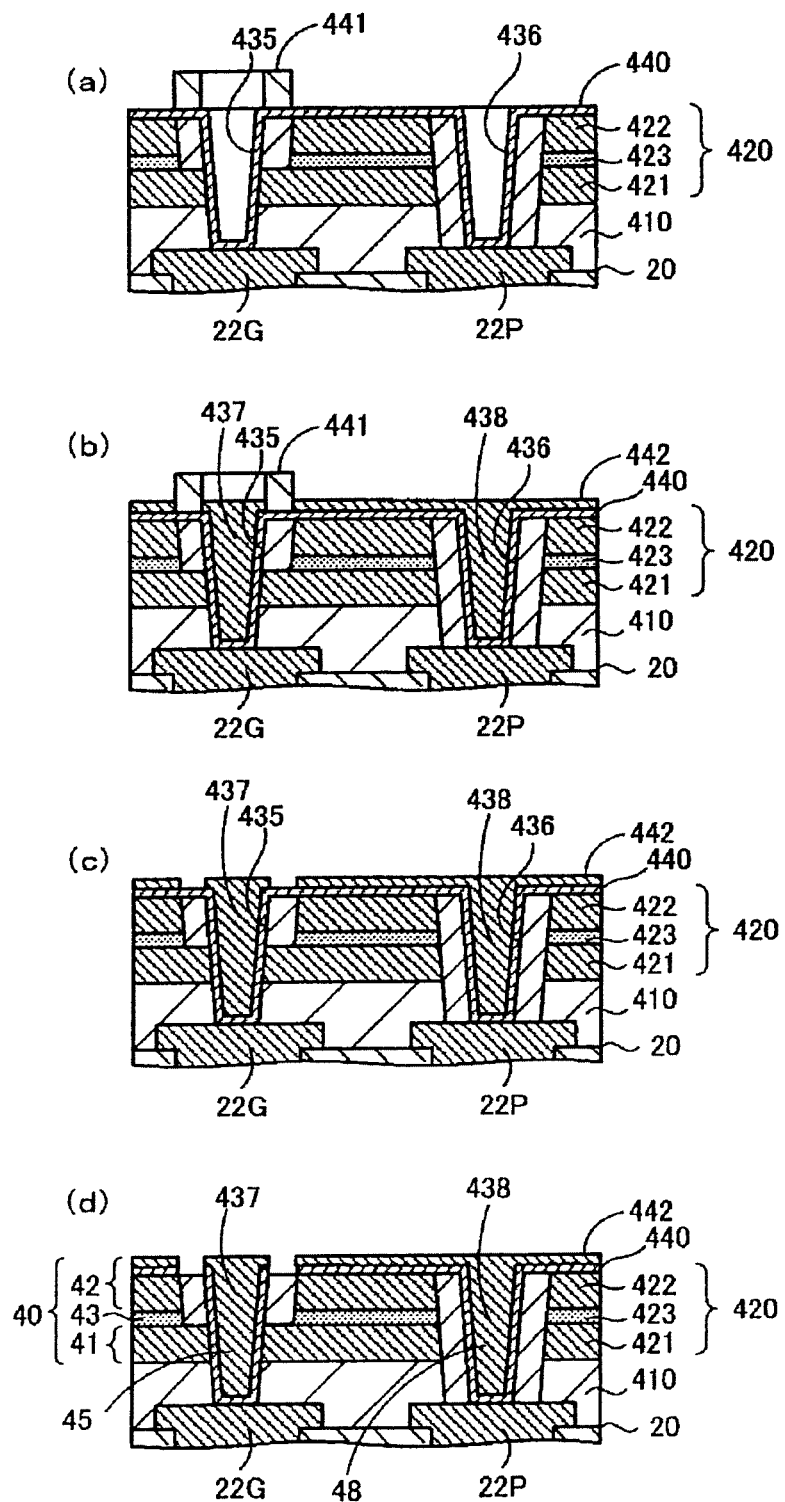
FIGS. 7(a)-7(d) are cross-sectional views of the multilayered PCB under production after the steps shown in FIGS. 6(a) and 6(b)

FIGS. 6(a) and 6(b) illustrate the production of multilayered PCB 10, following the steps shown in FIGS. 4(a)-4(d). Referring to FIGS. 6(a) and 6(b), through-holes 435 and 436 are formed respectively in inner-hole resins 433 and 434 and immersed in a potassium permanganate solution to roughen the surface, then dry set for three hours at 170° C. until completely set (see FIG. 6(a)). The diameter of through-hole 435 is smaller than that of inner-hole resin 433, and through-hole 435 penetrates nickel foil 421 and interlayer insulation layer 410 and reaches the top surface of conductive layer (22G). The diameter of through-hole 436 is smaller than that of inner-hole resin 434, and through-hole 436 penetrates inner-hole resin 434 and reaches the top surface of conductive layer (22P). Through-hole 435 is formed by using a UV laser under conditions calling for 25 kHz frequency, 3 W power output and 52 shots. Through-hole 436 is formed by applying a $CO_2$ laser beam through a Φ1.4 mm mask under conditions of energy density 2.0 mj, pulse width 20 μsec. and 2 shots. After a catalyst for electroless copper plating is applied on its surface, the substrate is immersed in a copper plating solution and an electroless copper-plated film 440 is formed on the substrate. The thickness of the plated film 440 is in the range of 0.6-3.0 μm (see FIG. 6(b)). The composition of the electroless copper plating solution for the above procedure is as follows: copper sulfate: 0.03 mol/L, EDTA: 0.200 mol/L, HCHO: 0.1 g/L, NaOH: 0.1 mol/L, α,α'-bipyridyl: 100 mg/L, polyethylene glycol (PEG): 0.1 g/L.

FIGS. 7(a)-7(d) illustrate the production of multilayered PCB 10, following the steps shown in FIGS. 6(a) and 6(b). Referring to FIGS. 7(a)-7(d), a dry film is attached onto electroless copper-plated film 440, exposed to light and developed to form a doughnut-shaped plating resist 441 surrounding the opening of through-hole 435 (see FIG. 7(a)). On the area except where the plating resist 441 is located, a 25 μm-thick electrolytic plating film 442 is formed on electroless copper-plated film 440 (see FIG. 7(b)). Accordingly, the inner portion of through-holes 435 and 436 plated with copper becomes via-hole conductors 437 and 438, respectively. The composition of the electrolytic copper plating solution for the above procedure is as follows: sulfuric acid: 200 g/L, copper sulfate: 80 g/L, additive: 19.5 ml/L (made by Atotech Japan, product name CUPRACID GL). In one example, the electrolytic copper plating is performed for 115 minutes at a current density of 1 A/dm$^2$ and a temperature of 23±2° C. After plating resist 441 is peeled off, a part of electroless copper plating film 440 covered by the resist 441 is removed by an etching process using a sulfuric acid-hydrogen peroxide type etching solution (quick etching, see FIG. 7(d)). By these procedures, via-hole conductor 437 becomes electrically disconnected from copper foil 422, and thin-film capacitor 40 is formed on core substrate 20. Namely, the nickel foil 421 becomes lower electrode 41, high-dielectric layer 423 becomes high-dielectric layer 43, and portions of copper foil 422, electroless copper plating film 440 and electrolytic copper film 442, all of which are positioned above high-dielectric layer 423, become upper electrode 42. Also, via-hole conductor 437 becomes lower via-hole conductor 45 and via-hole conductor 438 becomes upper via-hole conductor 48.

Figure 8:
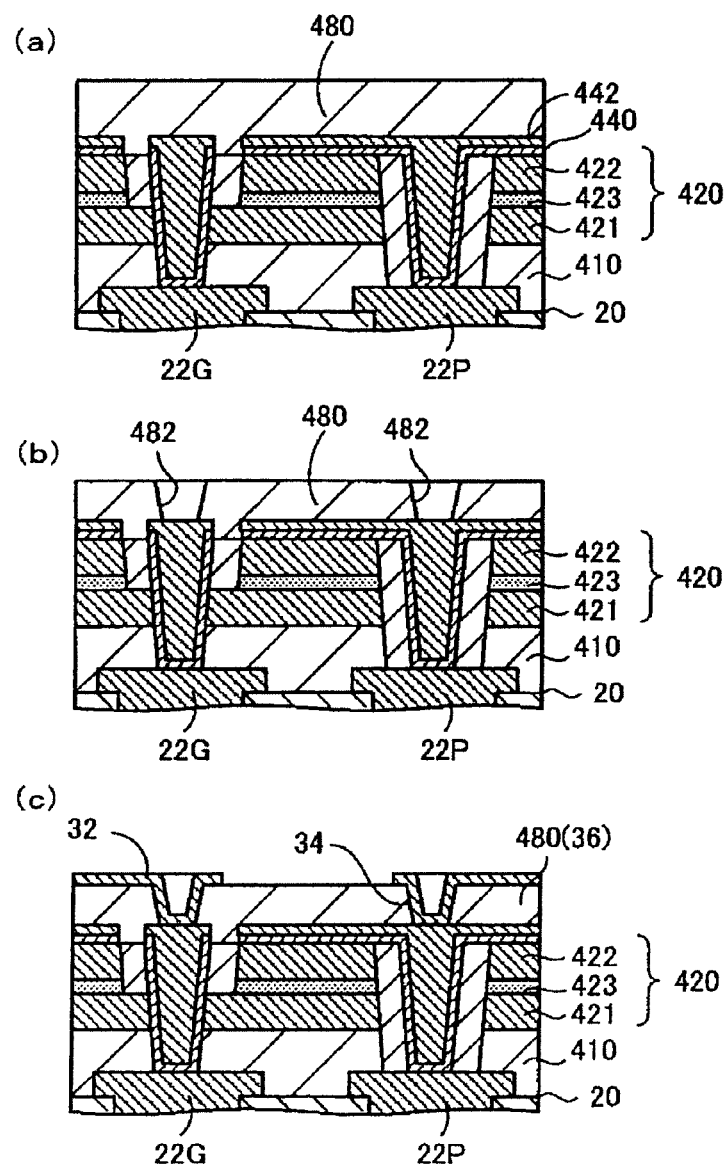
FIGS. 8(a)-8(c) are cross-sectional views of the multilayered PCB under production after the steps shown in FIGS. 7(a)-7(d)

FIGS. 8(a)-8(c) illustrate the production of multilayered PCB 10, following the steps shown in FIGS. 7(a)-7(d). Referring to FIGS. 8(a)-8(c), electrolytic copper plating film 442, formed on the unfinished substrate, is treated in a blackening bath (oxidation bath) using a solution which includes NaOH (10 g/L), $NaClO_2$ (40 g/L), and $Na_3PO_4$ (6 g/L), and in a reduction bath using a solution which contains NaOH (10 g/L) and $NaBH_4$ (6 g/L), to form a roughened surface on electrolytic copper plating film 442 (not shown in the drawing). Then, a resin insulation sheet 480 is attached to the roughened surface by using a vacuum laminator under conditions calling for a temperature in the range of 50-150° C. and a pressure in the range of 0.5-1.5 MPa, and then hardened for three hours at 150° C. (see FIG. 8(a)). This resin insulation sheet 480 may be denatured epoxy type resin sheet, polyphenylene ether type resin sheet, polyimide type resin sheet, cyano ester type resin sheet or imide type resin sheet. The resin sheet may include thermoplastic resins such as polyolefin type resin or polyimide type resin, thermosetting resins such as silicone resin, and/or rubber type resins such as SBR, NBR, or urethane, and may also contain fiber-, filler- or flat-shaped inorganic materials such as silica, alumina or zirconia dispersed therein. Then, a hole 482 is formed at a predetermined position of resin insulation sheet 480 by using a $CO_2$ laser (see FIG. 8(b)). After performing a roughening process and electroless copper plating, a plating resist is provided on the surface, exposed to light, and developed to form a resist pattern. Next, electrolytic copper plating is performed according to the pattern, and the plating resist is removed thereafter. Then, portions of electroless copper-plated film covered by the plating resist are removed by etching and BU conductive layer 32 is formed (see FIG. 8(c)). The resin insulation sheet 480 shown in FIG. 8(c) becomes BU insulation layer 36, and the plating inside the hole 482 becomes via-hole conductor 34. By repeating the steps of FIGS. 8(a)-8(c), BU part 30 (see FIG. 2) is produced. Ground pads 61, power source pads 62 and signal pads 63 are formed on the topmost layer of BU part 30, and the multilayered PCB 10 shown in FIGS. 1 and 2 is obtained.

According to the present embodiment, during the production of high-dielectric sheet 420, which is to become thin-film capacitor 40, if pits occur in first sputter film (423a), the sol-gel solution seeps into the pits and fills them up. Also, second sputter film (423c) is formed on intermediate layer (423b) in high-dielectric layer 423. Even if pits occur in second sputter film (423c), they will be smaller and shallower, since second sputter film (423c) is thinner in the present embodiment, compared to the case where a high dielectric layer is made of a single sputter film. Namely, in high-dielectric layer 423, if pits occur on the surface opposite to nickel foil 421, they are smaller and shallower than pits that are produced in a high-dielectric layer made of a single sputter film. Therefore, even if foreign materials (resins or metals such as copper) enter the pits, they will not cause a major problem. Furthermore, intermediate layer (423b) is sandwiched between first and second sputter films (423a) and (423c), and thus is not exposed. As such, even if pinholes are formed on the surface of intermediate layer (423b), the plating solutions used to form copper foil 422 do not seep into those holes. Accordingly, occurrence of cracks is more effectively prevented in high-dielectric layer 43 of thin-film capacitor 40. Short-circuits between lower electrode 41 and upper electrode 42 are also prevented.

Moreover, the capacitance of thin-film capacitor 40 is larger, since high-dielectric layer 423 is made thinner, with its thickness ranging from 0.4 to 3 μm. Therefore, the device has few sudden falls in electrical potential of power source caused by high-speed on/off switching of semiconductor element 70 mounted on multilayered PCB 10.

Further, since the individual thickness of first and second sputter films (423a) and (423c) is 0.1 μm or greater, the intermediate layer (423b), sandwiched between first and second sputter films (423a) and (423c), is completely isolated from surroundings.

Since intermediate layer (423b) is also formed thicker than first sputter film (423a) and second sputter film (423c), pits that could occur on first and second sputter films (423a) and (423c) are even smaller and shallower and cause much less potential problems. In addition, according to the above-mentioned embodiment, second sputter film (423c) is formed thinner than first sputter film (423a), occurrence of problems are further suppressed.

Furthermore, soon after high-dielectric sheet 420 is produced, low- and high-temperature treatments are conducted several times to select a sheet that shows no problems and use it in the next production process. By excluding a potentially problematic sheet before mounting it on a multilayered PCB 10, the cost is significantly reduced, compared to having to remove one after it is mounted.

According to the above-described embodiment, thin-film capacitor 40 is formed on core substrate 20, and build-up part 30 is formed on thin-film capacitor 40. However, build-up part 30 may be formed on core substrate 20 and then thin-film capacitor 40 on top of build-up part 30.

In the above-described embodiment, nickel is used to form lower electrode 41. However, copper, platinum, gold or silver may be used instead. Also, copper is used to form upper electrode 42, but other metals such as nickel and tin may be used.

Furthermore, a magnetron sputtering apparatus is used in the sputtering process in the above-described method, but a tri-polar or ion-beam sputtering apparatus may be used.

In the above-described embodiment, the cross-section of BU via-hole conductor 34 is formed in a tumbler shape (what is called a conformal via-hole), but it may also be a filled-type via-hole, which is a tumbler-shaped hole filled with a metal or conductive resin.

EXAMPLES

Table 1 shows multilayered PCBs 10 of Examples 1-8 prepared by the above-described method of producing high-dielectric sheet 420 and multilayered PCB 10 according to the present embodiment. For the purpose of comparison, multi-layered PCBs of Comparative Examples 1-2 were also produced and evaluated. The first sputter film, intermediate layer and second sputter film of the high-dielectric sheets in Examples 1-8 and Comparative Examples 1-2 are all made of barium titanate.

<Percentage of Evaluated Products that Passed the Test>

In Examples 1-8 and Comparative Examples 1-2, 100 multilayered PCBs 10 per example were produced and their connectivity was tested. In connectivity tests explained below referring to FIG. 9, the following lines were checked if they were disconnected: (1) ground line 71 connecting each ground pad 61 of mounting part 60 to the corresponding external ground terminal 81, which is located on the surface opposite to mounting part 60, via lower electrode 41 of thin-film capacitor 40; (2) power source line 72 connecting each power source pad 62 of mounting part 60 to the corresponding external power source terminal 82, via upper electrode 42 of thin-film capacitor 40; and (3) multiple signal lines 73 connecting each signal pad 63 to the corresponding external signal terminals 83 without making contact with lower electrode 41 or upper electrode 42.

Also, tests were conducted to determine whether short-circuiting occurs among the ground line 71, power source line 72 and signal lines 73. The evaluated multilayered PCBs 10 passed the test if all the lines showed no sign of disconnection or short-circuits, but it failed if at least one line showed any sign of disconnection or short-circuits. Among 100 multilayered PCBs 10 tested in each category, the number that passed is shown in percentages in Table 1.

<Reliability Test 1>

For each of Examples 1-8, reliability tests were conducted as follows. Several ground pads 61 were selected from numerous ground pads 61 formed on mounting part 60 of multilayered PCB 10, and the electrical resistance value between the ground pads 61 and the corresponding external ground terminal 81 was measured. Also, several power supply pads 62 on mounting part 60 were selected, and the electricity resistance value between the power supply pads 62 and the corresponding external power supply terminal 82 was also measured. Each result was recorded as an initial value (R0). Next, voltage of 3.3 volts was applied between upper electrode 42 and lower electrode 41 of thin-film capacitor 40, and the capacitor 40 was charged and then discharged. The process of charging and discharging was repeated 50 times.

Then, a heat cycle test, in which multilayered PCB 10 was left at −55° C. for 5 minutes and at 125° C. for 5 minutes, was repeated 500 times. After these tests, measurements were made of connection resistance values (R) between pads and corresponding external terminals, where initial values (R0) were measured earlier. From the (R) value obtained between each pad and its corresponding external terminal, each initial value (R0) was subtracted, divided by the (R0) and multiplied by 100 (100×(R−R0)/R0) (%). If all the values obtained were within the range of ±10%, the Example passed the reliability test. If not, it failed. The results are shown in Table 1. The multilayered PCBs 10 in the tested Examples and Comparative Examples each have basically the same structures as shown in FIGS. 1 and 2, having common material, size and position of each part remaining constant, and differing only in parameters provided in Table 1.

<Reliability Test 2>

Except that the number of test times of charging and discharging was 100, and the number of repeated heat cycle tests was 1,000, all other conditions were the same as the Reliability Test 1. The results are shown in Table 1.

occurred in intermediate layer (423b), plating solutions could not seep into those pinholes, thus short-circuits were seemingly prevented. Other factors related to the excellent passing rates seem to be that the total thickness of high-dielectric layer 423 was in the range of 0.4-3 μm, that intermediate layer (423b) was thicker than both first sputter film (423a) and second sputter film (423c), and that intermediate layer (423b) was completely insulated by making the thicknesses of first and second sputter films (423a) and (423c) each 0.1 μm or greater.

In Reliability Test 1, Examples 1-8 all had good results, but in Reliability Test 2, only Examples 1 and 2 fared well. The reasons for this may be related to the fact that the pits that occurred on the surface of second sputter film (423c) were small and shallow because second sputter film (423c) was formed thinner than first sputter film (423a).

As discussed above, in a method to produce a high-dielectric sheet used as a thin-film capacitor provided inside a PCB, according to the above embodiment of the present invention, a high-dielectric layer is provided on a first electrode by forming, layer by layer, a first sputter film by using a sputter-

TABLE 1

| Examples | thickness (μm) 1st sputter film | thickness (μm) intermediate layer | thickness (μm) 2nd sputter film | total thickness (μm) | test passing rate (%) | reliability test 1 | reliability test 2 |
|---|---|---|---|---|---|---|---|
| Example 1 | 0.25 | 0.3 | 0.15 | 0.7 | 100 | Pass | Pass |
| Example 2 | 1 | 1.4 | 0.6 | 3 | 100 | Pass | Pass |
| Example 3 | 0.1 | 0.2 | 0.1 | 0.4 | 100 | Pass | Fail |
| Example 4 | 0.2 | 0.3 | 0.2 | 0.7 | 100 | Pass | Fail |
| Example 5 | 0.25 | 0.35 | 0.25 | 0.85 | 100 | Pass | Fail |
| Example 6 | 0.5 | 0.55 | 0.5 | 1.55 | 100 | Pass | Fail |
| Example 7 | 0.6 | 0.8 | 0.6 | 2 | 100 | Pass | Fail |
| Example 8 | 0.8 | 1.4 | 0.8 | 3 | 100 | Pass | Fail |
| Comparative Example 1 | 0.85 | 0 | 0 | 0.85 | 30 | — | — |
| Comparative Example 2 | 0 | 0.85 | 0 | 0.85 | 20 | — | — |

As clearly shown in Table 1, only 20 percent of the evaluated multilayered PCBs 10 passed the test in Comparative Example 1, and 30 percent in Comparative Example 2, whereas 100 percent passed in Examples 1-8. In Comparative Example 1, high-dielectric layer 423 of high-dielectric sheet 420 consists of a single sputter film only, and in Comparative Example 2, it is made of only an intermediate layer formed by calcining a sol-gel film, whereas in Examples 1-8, each high-dielectric layer 423 has a three-layer structure of first sputter film (423a)/intermediate layer (423b)/second sputter film (423c). When high-dielectric layer 423 was comprised of a sputter film alone, large, deep pits occurred on the surface. Those pits appeared to become the starting points of problem-causing cracks, thereby lowering the passing rate. When high-dielectric layer 423 was made of an intermediate layer only, it seemed that pinholes occurred where organic materials and solvents decomposed or evaporated, and plating solutions seeped into those pinholes, potentially causing short-circuits, thereby lowering the passing rate. Compared with those Comparative Examples, in Examples 1-8, even if pits occurred on the surface of high-dielectric layer 423, they were likely to be smaller and shallower, since second sputter film (423c) was thinner. Thus, cracks starting from pinholes were seemingly prevented. Intermediate layer (423b) was sandwiched between first sputter film (423a) and second sputter film (423c), and was not exposed. Even if pinholes ing process, a sol-gel film by using a sol-gel process, and a second sputter film by using a sputtering process, and an opposite electrode facing the first electrode is provided on the second sputter film.

According to the above-described method, if pits occur when the first sputter film is formed, they will be filled when a sol-gel film is formed onto the first sputter film and the sol-gel solution seeps into them. The second sputter film, formed on the sol-gel film, is thinner than that of a high-dielectric layer comprised only of a single sputter film. Thus, even if pits occur on the second sputter film, they are smaller and shallower and if foreign materials (such as metal or resin) seep into the pits, they will not cause a major problem. Furthermore, since the sol-gel film is sandwiched between the first and second sputter films, if pinholes occur, any plating solutions or etchants that might be around the high-dielectric layer will not seep into those pinholes. Therefore, according to the method of the present embodiment, cracks in the high-dielectric layer are prevented, and short-circuits between the opposing electrodes are also prevented.

In the production method of a high-dielectric sheet according to the present embodiment, the thickness of the high-dielectric layer is preferably in the range of 0.4-3 μm. If the thickness is within that range, the capacitance of the high-dielectric sheet is high enough to effectively prevent a sudden drop in electrical potential caused by switching on/off the semiconductor element mounted on the PCB at a high speed. If the high-dielectric layer is thinner than the above range, the risk of cracks developing in the high-dielectric layer or of short-circuits occurring between the opposing electrodes may be higher. Thus, employing the production method of the present embodiment is advantageous in eliminating the risk.

In the production method of a high-dielectric sheet according to the present embodiment, the thickness of each sputter film is preferably 0.1 µm or greater. If the thickness is in that range, the sol-gel film sandwiched between the first and second sputter films is well isolated from surroundings.

In the production method of a high-dielectric sheet according to the present embodiment, the sol-gel film is preferably thicker than the first and second sputter films. If the sol-gel film is thicker, pits occurring in the first and second sputter films will be even smaller and shallower than otherwise, and problems caused by pits may occur less frequently. Further, the above-mentioned second sputter film should be preferably thinner than the above-mentioned first sputter film.

In the production method of a high-dielectric sheet according to the present embodiment, after an opposing electrode is formed, high-dielectric sheets having a high-dielectric layer sandwiched between the opposing electrodes are subjected to lower-temperature treatment and higher-temperature treatment multiple times, and ones that are substantially free from defects are selected. Through this selection process, a defective high-dielectric sheet is excluded before it is incorporated into a PCB. This method is less costly than removing a defective sheet after it is already positioned on the board. During the above lower-temperature process, the sheet is left for a predetermined period of time at 0° C. or lower, and during the above higher-temperature process for a predetermined period of time at 100° C. or higher.

Throughout this specification, descriptions are made by using terms such as "top" and "bottom" for ease of explanation of the positional relationships of the structural elements. However, structures are not limited to those described above, that is, positions may be upside down, and right and left may be reversed.

Obviously, numerous modifications and variations of the present invention are possible in light of the above teachings. It is therefore to be understood that within the scope of the appended claims, the invention may be practiced otherwise than as specifically described herein.

What is claimed is:

1. A high-dielectric sheet for a printed circuit board, comprising:
   a first electrode;
   a first sputter film formed on the first electrode;
   an intermediate layer formed on the first sputter film by calcining a sol-gel film;
   a second sputter film formed on the intermediate layer; and
   a second electrode provided on the second sputter film.

2. The sheet according to claim 1, wherein the first sputter film, the intermediate layer and the second sputter film have a total thickness in the range between 0.4 and 3 µm.

3. The sheet according to claim 1, wherein the first sputter film has a thickness of 0.1 µm or greater.

4. The sheet according to claim 1, wherein the second sputter film has a thickness of 0.1 µm or greater.

5. The sheet according to claim 1, wherein the intermediate layer is thicker than the first and second sputter films.

6. The sheet according to claim 1, wherein the second sputter film is thinner than the first sputter film.

7. The sheet according to claim 1, wherein the first sputter film, the intermediate layer and the second sputter film comprise at least one material selected from the group consisting of barium titanate, $SrTiO_3$, $TaO_3$, $Ta_2O_5$, lead zirconate titanate, lead lanthanum zirconate titanate, lead niobium zirconate titanate, lead calcium zirconate titanate and lead strontium zirconate titanate.

8. The sheet according to claim 1, wherein the first electrode comprises a material selected from the group consisting of nickel, copper, platinum, gold and silver.

9. The sheet according to claim 1, wherein the second electrode comprises a material selected from the group consisting of copper, nickel and tin.

10. A printed circuit board comprising:
    a core substrate; and
    a capacitor positioned over the core substrate, the capacitor having a first electrode, a first sputter film formed on the first electrode, an intermediate layer formed on the first sputter film by calcining a sol-gel film, a second sputter film formed on the intermediate layer, and a second electrode provided on the second sputter film.

* * * * *